(12) United States Patent
Ramakrishna

(10) Patent No.: US 7,595,551 B2
(45) Date of Patent: Sep. 29, 2009

(54) SEMICONDUCTOR PACKAGE FOR A LARGE DIE

(75) Inventor: Kambhampati Ramakrishna, Chandler, AZ (US)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 11/169,850

(22) Filed: Jun. 28, 2005

(65) Prior Publication Data

US 2005/0236702 A1  Oct. 27, 2005

Related U.S. Application Data

(62) Division of application No. 10/606,429, filed on Jun. 25, 2003, now Pat. No. 6,927,479.

(51) Int. Cl.
*H01L 23/02* (2006.01)

(52) U.S. Cl. .................... 257/686; 257/777; 257/666; 257/E25.006; 257/E25.013

(58) Field of Classification Search ........ 257/666–667, 257/676, 783, 787, 686, 777, E25.006, E25.013
See application file for complete search history.

(56) References Cited

U.S. PATENT DOCUMENTS

| | | | | |
|---|---|---|---|---|
| 5,536,970 | A * | 7/1996 | Higashi et al. | 257/676 |
| 6,677,663 | B1 * | 1/2004 | Ku et al. | 257/666 |
| 6,753,597 | B1 * | 6/2004 | Crowley et al. | 257/676 |
| 6,759,737 | B2 * | 7/2004 | Seo et al. | 257/686 |
| 7,170,149 | B2 * | 1/2007 | Shirasaka et al. | 257/666 |

* cited by examiner

*Primary Examiner*—Hoai v Pham
(74) *Attorney, Agent, or Firm*—Mikio Ishimaru

(57) ABSTRACT

A semiconductor package is provided. A semiconductor package has a die pad and a plurality of bonding fingers. A spacer is attached to the die pad, and a large die is attached to the spacer. The large die is wire bonded to the plurality of bonding fingers using a plurality of bonding wires. The die pad, plurality of bonding fingers, spacer, large die, and bonding wires are encapsulated to form the semiconductor package. The semiconductor package can be either a single or dual row package, such as a QFN or BGA package.

10 Claims, 7 Drawing Sheets

SEMICONDUCTOR PACKAGE FOR A LARGE DIE

CROSS-REFERENCE TO RELATED APPLICATION(S)

This is a Divisional of application Ser. No. 10/606,429 filed Jun. 25, 2003, now U.S. Pat. No. 6,927,479 which is hereby incorporated by reference herein.

TECHNICAL FIELD

The present invention relates generally to semiconductor packages, and more specifically to a method and apparatus for packaging large dies in such packages.

BACKGROUND ART

The trend toward miniaturization of electronic equipment has required high-density packaging of semiconductor devices. To meet this requirement, semiconductor packages have been reduced both in area and thickness, while the size and complexity of dies within the packages have increased. As a result, there has been a growing demand for semiconductor packages which accommodate large dies.

A leadless leadframe package (LLP) is a semiconductor package design that contemplates the use of a metal (typically copper) leadframe structure in the formation of a chip scale package (CSP).

A typical leadless leadframe package includes a copper leadframe strip or panel which is patterned, typically by etching, to define a plurality of arrays of chip substrate features. Each chip substrate feature includes a die pad and a plurality of bonding fingers disposed about their associated die pad. A plurality of package electrical input-output terminal contact pads (contact pads) are defined on the bottom surface of the bonding fingers typically with an etch process. A plurality of very fine tie bars is used to mechanically connect and support the die pad and bonding fingers during manufacture.

During assembly, dies are attached to the respective die pads and conventional wire bonding is used to electrically couple bond pads on each die to their associated bonding fingers on the leadframe strip. After the wire bonding, a plastic cap is molded over the top surface of each of the array of wire bonded dies. The dies are then singulated and tested using conventional sawing or punching and testing techniques.

Certain semiconductor packages include a die pad and a plurality of bonding fingers with inner and outer contact pads thereby allowing semiconductor packages to be manufactured in a very compact size while being able to accommodate dies having a relatively large number of contacts In these semiconductor packages, however, the size of the die that can be used is limited by the size of the die pad depending upon the particular package being used. Two of these types of semiconductor packages are the QFN (Quad Flat-Packed Non-Leaded) and Leadframe Ball Grid Array (BGA) packages. These types of packages are desirable because they have a low vertical profile enabling them to be placed into small electronic products.

Attempts have been made to adapt these types of packages so that a large die can be used within a given sized package while maintaining the low profile of the package. A "large" die is a die that has a pair of opposing edges extending laterally beyond the edges of the die pad in a semiconductor package.

One such attempt includes providing a die pad with a centrally located raised "up-set" portion that raises the die pad above the upper surface of the bonding fingers so the outer periphery of the die can extend laterally beyond the edges of the die pad. This results in a support for the die pad that is substantially reduced in area thereby raising manufacturing issues during wire bonding and molding operations after the die is mounted to the die pad. The die is more likely to tilt during these operations due to the reduced support provided by the up-set portion of the die pad.

Reduced "up-set" dimensions also increase the die overhang thereby effectively reducing limiting the largest die size, because of wirebond limitation on the overhang portion of the die.

If the area of the up-set portion of the die pad is increased to reduce the amount of possible die tilt during subsequent packaging operations, less area of the die pad is available for subsequent solder joining of the die pad to a printed circuit board thereby reducing the heat removal efficiency of the package through the printed circuit board.

This type of special die pad assembly also is more expensive and difficult to manufacture.

Solutions to these problems have been long sought, but prior developments have not taught or suggested any solutions and, thus, solutions to these problems have long eluded those skilled in the art. Accordingly, there is a need for a semiconductor package that accommodates larger dies, but overcomes the problems mentioned above.

DISCLOSURE OF THE INVENTION

The present invention provides a semiconductor package and a method of assembly therefor. A die pad and a plurality of bonding fingers with contact pads defined on their bottom surface are provided. A spacer is attached to the die pad, and a large die is attached to the spacer. The large die is wire bonded to the plurality of bonding fingers. The die pad, bonding fingers, spacer, large die, and bonding wires are encapsulated to form the semiconductor package. The present invention allows a large die to fit into a given semiconductor package while maintaining the vertical profile of the package by an inexpensive and simple method. The present invention can be used with various packages, such as single or dual row packages.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
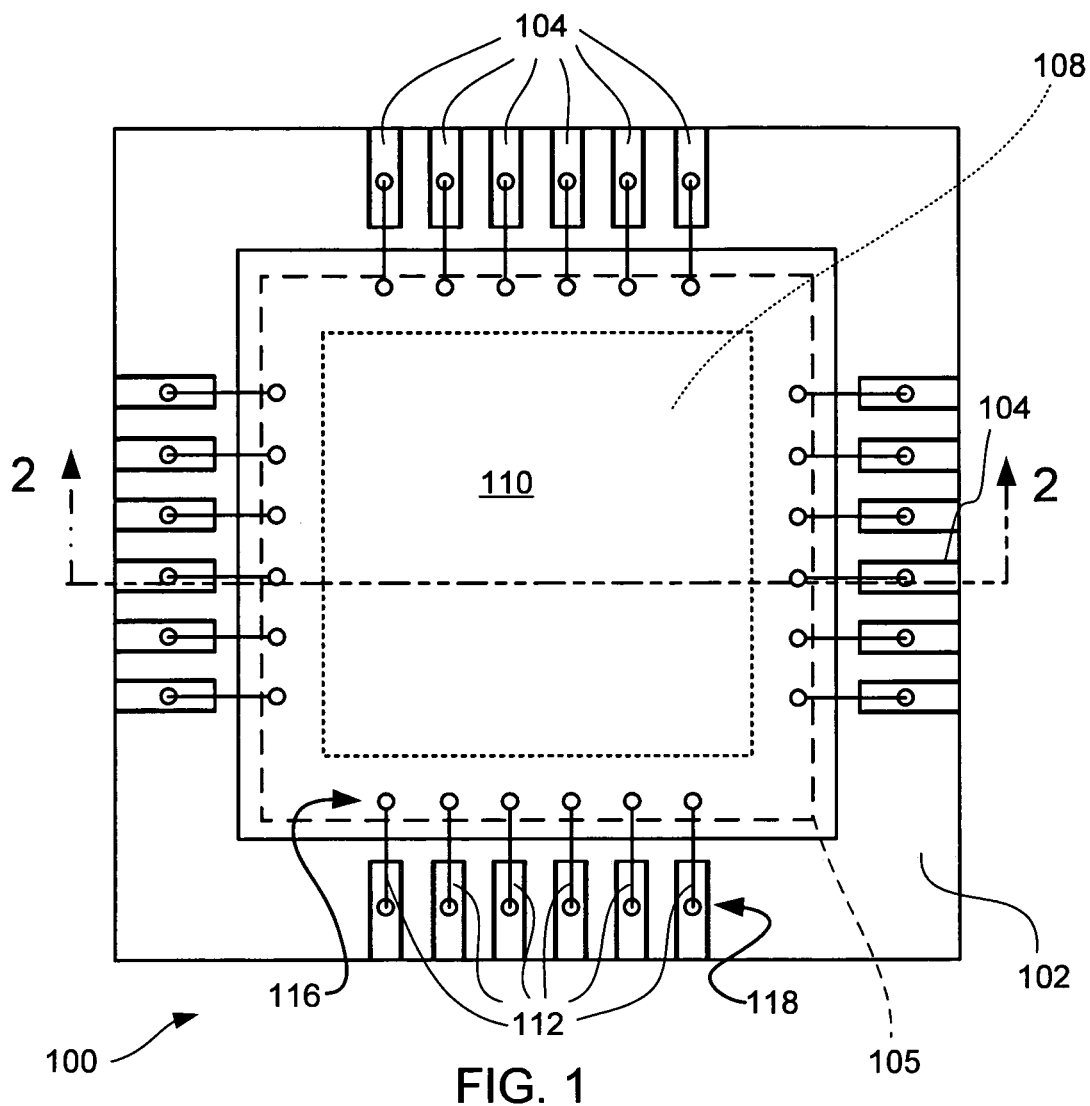
FIG. 1 is a plan view of a semiconductor package manufactured in accordance with the present invention.

Referring now to FIG. 1, therein is shown a plan view of a QFN semiconductor package 100 manufactured in accordance with the present invention. The semiconductor package 100 comprises an encapsulant 102, which encapsulates a plurality of bonding fingers 104 around the periphery of a die pad 105, which is located centrally of the encapsulant 102. Attached to the die pad 105 is a spacer 108. A large die 110 is mounted on top of the spacer 108. A plurality of bonding wires 112 connects the large die 110 to the plurality of bonding fingers 104. A first plurality of wirebond connections 116, typically ball bonds is used to connect the plurality of bonding wires 112 to the large die 110. A second plurality of wirebond connections 118, typically ball bond for reverse loop wirebonding and stitch bond for standard loop wirebonding is used to connect the plurality of bonding wires 112 to the plurality of bonding fingers 104.

The term "horizontal" as used in herein is defined as a plane parallel to the conventional surface of a die, regardless of its orientation. The term "vertical" refers to a direction perpendicular to the horizontal as just defined. Terms, such as "on", "upper", "lower", "top", "bottom", "above", "below", "over", and "under", are defined with respect to the horizontal plane.

Figure 2:
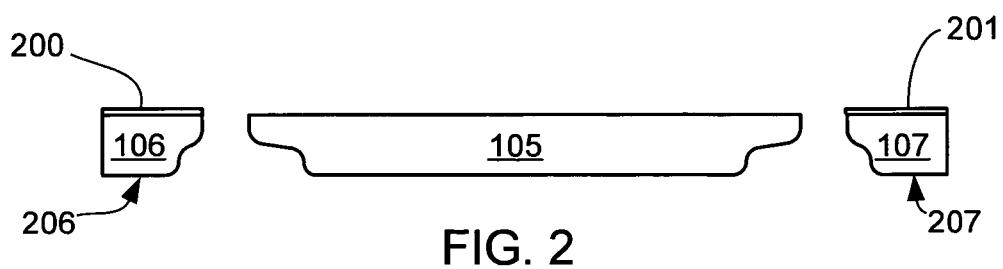
FIG. 2 is a cross-sectional view of a portion of the structure of FIG. 1 showing a die pad and an opposing pair of a plurality of bonding fingers taken along line 2-2 of FIG. 1.

Referring now to FIG. 2, therein is shown FIG. 2 is a cross-sectional view of a portion of the structure of FIG. 1 showing the die pad 105 and an opposing pair of the plurality of bonding fingers 104 taken along line 2-2 of FIG. 1. A first bonding finger 106 and a second bonding finger 107 shown in FIG. 2 are representative of the plurality of bonding fingers 104 shown in FIG. 1. The die pad 105 is located between the first bonding finger 106 and the second bonding finger 107.

The first bonding finger 106 and the second bonding finger 107 are made of a conductive material such as copper. A first bonding pad 200 is provided on the upper surface of the first bonding finger 106 and a second bonding pad 201 is provided on the upper surface of the second bonding finger 107. The first bonding pad 200 and the second bonding pad 201 are a conductive material, such as silver or other suitable material, plated onto the first bonding finger 106 and the second bonding finger 107, respectively. The die pad 105 is temporarily mechanically connected to the first bonding finger 106 and the second bonding finger 107 by a leadframe (not shown) in a conventional manner. The first bonding finger 106 also has a first contact pad 206, and the second bonding finger 107 has a second contact pad 207. The first contact pad 206 and the second contact pad 207 are used to subsequently connect the semiconductor package 100 to a printed circuit board.

The upper surfaces of the first bonding finger 106 and the second bonding finger 107 are in substantially the same horizontal plane. It will be readily apparent to those skilled in the art that the permissible size of a die that may be used is limited by the size of the die pad 105.

Figure 3:
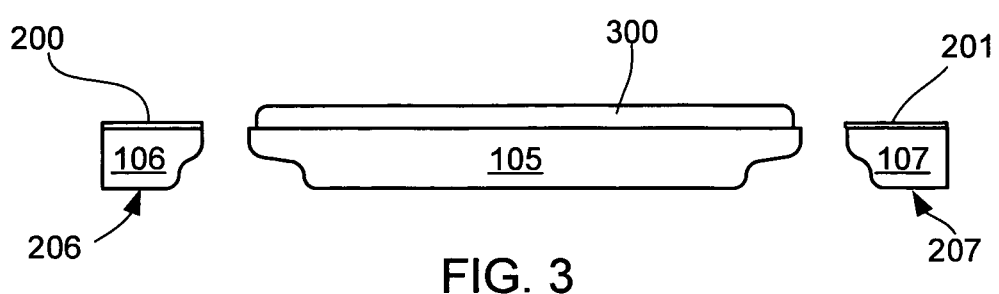
FIG. 3 is the structure of FIG. 2 after a first adhesive layer has been applied to the die pad.

Referring now to FIG. 3, therein is shown the structure of FIG. 2 after a first adhesive layer 300 has been applied to the die pad 105 in a conventional manner such as by applying an adhesive tape or dispensing an adhesive liquid or paste that is subsequently cured. The first adhesive layer 300 can be either electrically conductive or non-conductive as required in a particular application.

Figure 4:
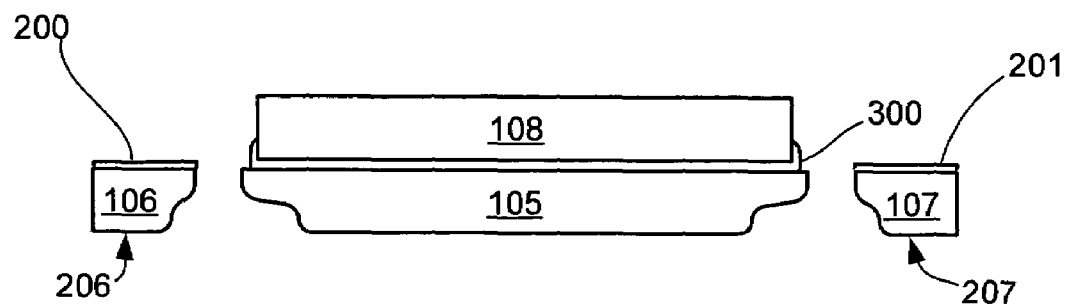
FIG. 4 is the structure of FIG. 3 after a spacer has been attached to the die pad.

Referring now to FIG. 4, therein is shown the structure of FIG. 3 with the spacer 108 attached to the die pad 105 using the first adhesive layer 300. The spacer 108 can be made of an inorganic conductive material selected from the group consisting of silicon (Si), ceramic, metal, and combinations thereof. The spacer 108 preferably has a relatively high thermal conductivity to conduct heat through the spacer 108 to the die pad 105 during operation. The spacer 108 also preferably has a high electrical conductivity for backside grounding of the large die 110.

If necessary or desirable, the spacer 108 also can be made of an organic material if required for a particular application. If an organic material is used for the spacer 108, it is preferable to use an organic material that provides high adhesion both to the large die 110 and the encapsulant 102, which can withstand severe moisture resistance tests without popcorn cracking. Such organic materials may be selected from the group of materials consisting of BT, FR4, FR5 and combinations thereof. BT, FR4 and FR5 are materials commonly used in printed circuit board fabrication.

Figure 5:
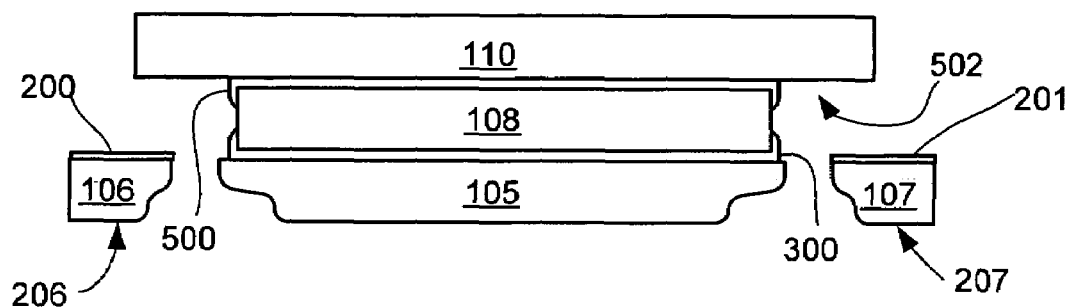
FIG. 5 is the structure of FIG. 4 after a large die has been attached to the spacer.

Referring now to FIG. 5, therein is shown the structure of FIG. 4 after the large die 110 has been attached to the spacer 108 using a second adhesive layer 500. The large die 110 is supported only by the die pad 105 and the spacer 108, which is smaller than the large die 110. Preferably, the spacer 108 is the largest permissible for the size of the die pad 105 being used to provide support for the large die 110 thereby reducing the likelihood and amount of die tilt that may occur during subsequent wire bonding operations and reducing the amount of lateral overhang of the large die 110 above the spacer 108 to enable reliable wirebonding.

The large die 110 has a bottom surface 502 that is positioned above the plane formed by the upper surfaces of the first bonding finger 106 and the second bonding finger 107. The large die 110 extends laterally over the edges of the die pad 105 and partially overlaps the first bonding finger 106 and the second bonding finger 107. Accordingly, the use of the spacer 108 permits the use of the large die 110 in the semiconductor package 100. The die size is no longer limited by the size of the die pad 105. The term "large die" as used herein defines a die, which has a pair of opposing edges extending laterally beyond the edges of the die pad in a semiconductor package. Although the large die 110 shown herein has a substantially square surface area, it will be appreciated that the present invention also can be used if the large die 110 has a rectangular surface area without departing from the spirit and scope of the present invention.

Depending upon the particular device being manufactured, the spacer 108 typically ranges in thickness of between about 100 microns and about 300 microns to position the bottom surface 502 of the large die 110 above the plane of the upper surfaces of the first bonding finger 106 and the second bonding finger 107 while maintaining the desired low vertical profile of the semiconductor package 100, and while enabling the voidless flow of the encapsulant 102. The spacer preferably has a thickness of between about 120 microns to about 150 microns.

As an illustrative example, and not intended to limit the scope of the present invention as claimed below, a 10 mm×10 mm a QFN has a die pad size of 8 mm×8 mm. The maximum die size that can be used in an application without ground bonds is approximately 7.65 mm×7.65 mm. If a die size greater than 8 mm×8 mm is needed, a larger package size is required to accommodate the die. A 10 mm×10 mm package manufactured in accordance with the present invention, however, can accommodate a large die size greater than the 7.65 mm×7.65 mm die previously permissible. It has been discovered that in accordance with the present invention a large die size greater than 8 mm×8 mm can fit in the 10 mm×10 mm package resulting in excess of a 9.4% increase in die size area that will fit into the same package thereby avoiding the need to use a larger package size and the associated increased cost.

Figure 6:
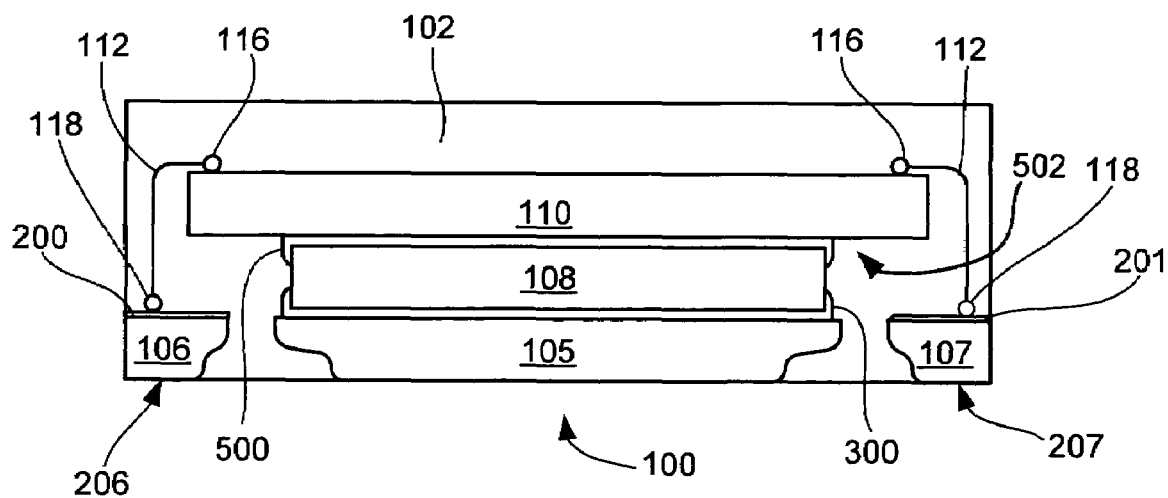
FIG. 6 is the structure of FIG. 5 after the large die has been electrically connected to the bonding fingers and then encapsulated in accordance with the present invention.

Referring now to FIG. 6, therein is shown the structure of FIG. 5 after the large die 110 is electrically connected to the first bonding finger 106 and the second bonding finger 107 using the plurality of bonding wires 112 in a conventional manner selected from the group consisting of ultrasonic bonding, thermosonic bonding, and combinations thereof using wire bonding equipment readily available in the semiconductor industry. In the embodiment shown, the plurality of bonding wires 112 are bonded to the large die 110 using the first plurality of wirebond connections 116, and to the first bonding pad 200 and the second bonding pad 201, respectively, using the second plurality of wirebond connections 118.

It has been discovered that use of a reverse loop wirebonding technique is preferred at the connection point on the large die 110 facilitates the use of the plurality of bonding wires 112 having substantially a 90° angle bend as shown in FIG. 6. The plurality of bonding wires 112 are substantially coplanar to have portions parallel with the upper surface of the large die 110 at the connection point to the large die 110 and sharply curved downward to have portions parallel to a side of the large die 110 to connect to the first bonding finger 106 and the second bonding finger 107, respectively. Thus, the desirable low vertical profile of the semiconductor package 100 is maintained despite the addition of the spacer 108. While reverse loop wirebonding is a preferred method, a standard loop wirebonding method also can be used without departing from the spirit and scope of the present invention.

Additionally, the large die 110 can extend over a portion of the first bonding finger 106 and the second bonding finger 107 thereby accommodating the largest die possible in a package of a given size. The assembly can then be encapsulated in the encapsulant 102, such as epoxy mold compound or other suitable material, using conventional molding equipment to form the semiconductor package 100.

The first contact pad 206 of the first bonding finger 106 and the second contact pad 207 of the second bonding finger 107 can then be used for subsequent connection of the semiconductor package 100 to a printed circuit board (not shown) in a conventional manner, such as by using a solder paste. The contact pads may also have-solder bumps (not shown) or other suitable connection materials or formations. It will be apparent to one skilled in the art that the edge of the large die 110 is laterally closer to the first contact pad 206 and the second contact pad 207 than would be the case if the spacer 108 were not used. The edge of the large die 110 also may extend laterally over at least a portion of the first bonding finger 106 and the second bonding finger 107. If the permissible die size is limited by the size of the die pad, the contact pads are arranged outside the edges of the die. Thus, the area of the semiconductor package 100 of the present invention more closely approximates the area of the large die 110. The semiconductor package 100 is closer to being a true chip scale package.

Figure 7:
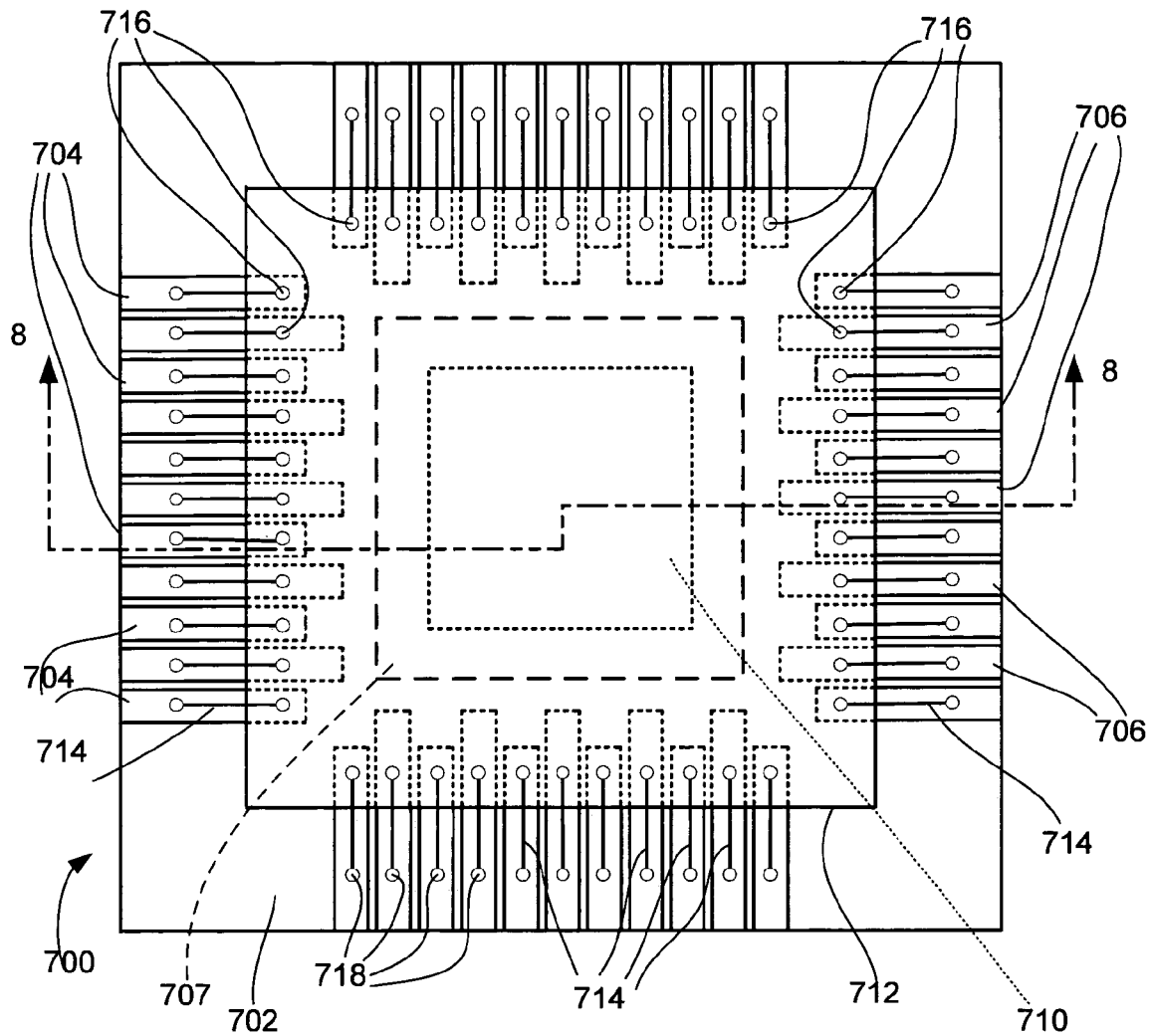
FIG. 7 is a plan view of another embodiment of a semiconductor package having a dual row of contact pads and corresponding bonding fingers manufactured in accordance with the present invention.

Referring now to FIG. 7, therein is shown a plan view of another embodiment of the present invention having a dual row of contact pads and corresponding bonding fingers. A semiconductor package 700, such as a QFN package, comprises an encapsulant 702, which encapsulates a plurality of outer bonding fingers 704, and a plurality of inner bonding fingers 706 positioned around the periphery of the encapsulant 702. A die pad 707 is located toward the center of the encapsulant 702. A spacer 710 is mounted on top of the die pad 707, and a large die 712 is mounted on top of the spacer 710. A plurality of bonding wires 714 connects the plurality of outer bonding fingers 704 and the plurality of inner bonding fingers 706 to the large die 712. A first plurality of wirebond connections 716, typically ball bonds, is used to connect the plurality of bonding wires 714 to the large die 712. A second plurality of wirebond connections 718, typically ball bond for reverse loop wirebonding and stitch bond for standard loop wirebonding, is used to connect the plurality of bonding wires 714 to the plurality of outer bonding fingers 704 and the plurality of inner bonding fingers 706.

Figure 8:
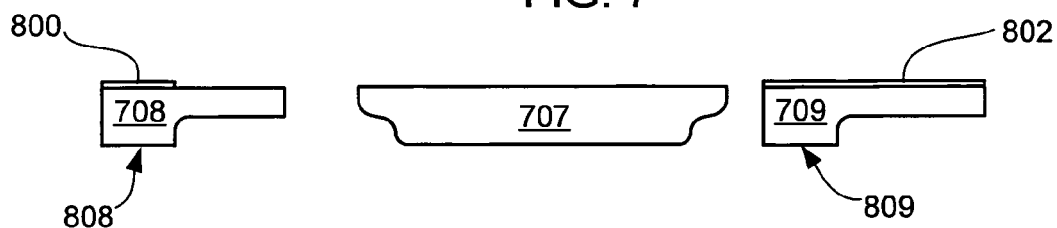
FIG. 8 is a cross-sectional view of a portion of the structure of FIG. 7 showing a die pad and an opposing pair of a plurality of bonding fingers taken along line 8-8 of FIG. 7.

Referring now to FIG. 8, therein is shown a cross-sectional view of a portion of the structure of FIG. 7 showing the die pad 707 and opposing ones of the plurality of outer bonding fingers 704 and the plurality of inner bonding fingers 706 shown in FIG. 7 taken along line 8-8 of FIG. 7. The die pad 707 is located between an outer bonding finger 708 and an inner bonding finger 709 which are located along the outer edge of the semiconductor package 700. The outer bonding finger 708 is representative of the plurality of outer bonding fingers 704 in FIG. 1, and the inner bonding finger 709 is representative of the plurality of inner bonding fingers 706 in FIG. 1. The outer bonding finger 708 and the inner bonding finger 709 are made of a conductive material such as copper. A first bonding pad 800 is provided on the upper surface of the outer bonding finger 708. A second bonding pad 802 is provided on the upper surface of the inner bonding finger 709. The first bonding pad 800 and the second bonding pad 802 are a conductive material, such as silver or other suitable material conventionally plated onto the upper surfaces of the outer bonding finger 708 and the inner bonding finger 709, respectively. The first bonding pad 800 may cover only an outer portion of the outer bonding finger 708, as shown, or may cover the entire upper surface of the outer bonding finger 708. Similarly, the second bonding pad may cover only an outer portion of the upper surface of the inner bonding finger 709, or, as shown, cover the entire surface of the inner bonding finger 709. The outer bonding finger 708 has a first contact pad 808, and the inner bonding finger has a second contact pad 809. The second contact pad 809 is under the large die 712 to form a very small semiconductor package 700 given the large size of the large die 712 while permitting a large number of contact pads for the large die 712. The first contact pad 808 and the second contact pad 809 are used to subsequently connect the semiconductor package 700 to a printed circuit board (not shown).

The leadframe, which temporarily mechanically connects the die pad 707 to the outer bonding finger 708 and the inner bonding finger 709, is omitted.

Figure 9:
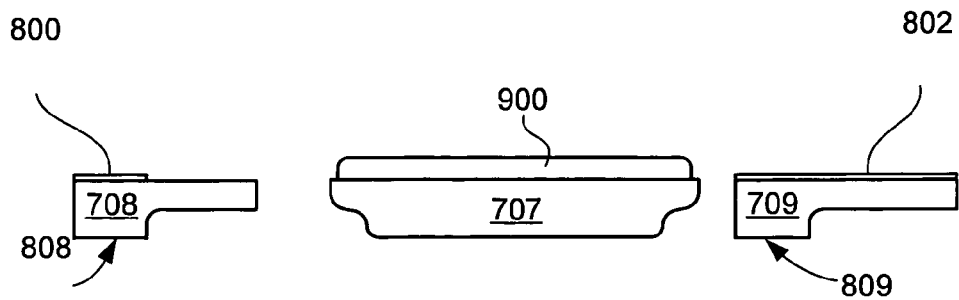
FIG. 9 is the structure of FIG. 8 after a first adhesive layer has been applied to the die pad.

Referring now to FIG. 9, therein is shown the structure of FIG. 8 after a first adhesive layer 900 has been applied to the die pad 707 in a conventional manner such as by applying an adhesive tape or dispensing an adhesive liquid or paste that is subsequently cured.

Figure 10:
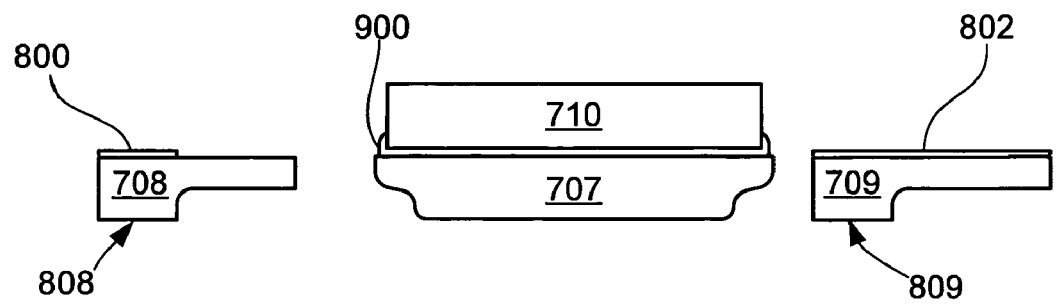
FIG. 10 is the structure of FIG. 9 after a spacer has been attached to the die pad.

Referring now to FIG. 10, therein is shown the structure of FIG. 9 with the spacer 710 attached to the die pad 707 using the first adhesive layer 900.

Figure 11:
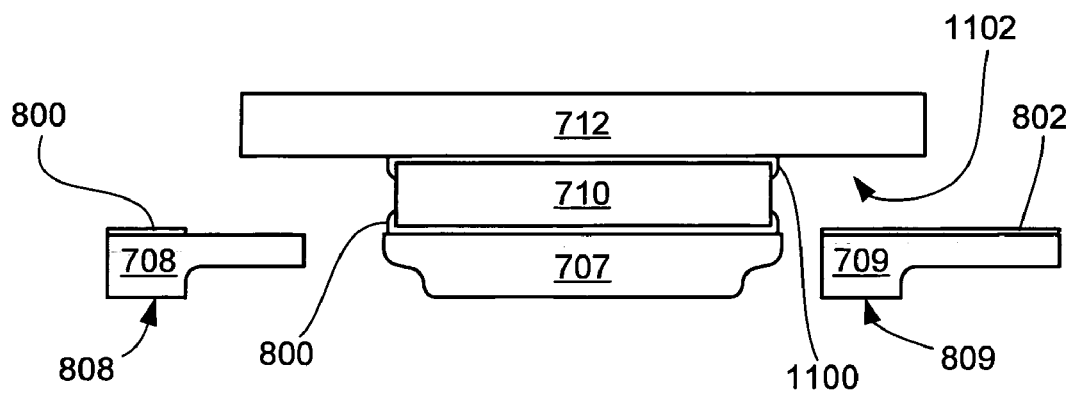
FIG. 11 is the structure of FIG. 10 after a large die has been attached to the spacer.

Referring now to FIG. 11 therein is shown the structure of FIG. 10 with the large die 712 attached to the spacer 710 using a second adhesive layer 1100. The large die 712 is supported only by the die pad 707 and the spacer 710, which is smaller than the large die 712. The large die 712 partially overlaps the second contact pad 809 attached to the inner bonding finger 709 and also overlaps the inner edge of the outer bonding finger 708 and the inner edge of the inner bonding finger 709. The large die 712 has a bottom surface 1102 that is positioned above the outer bonding finger 708 and the inner bonding finger 709. Accordingly, the use of the spacer 108 enables usage of the large die 712.

As a further illustrative example, and not intended to limit the scope of the present invention as claimed below, a 7 mm×7 mm a QFN package with a dual row of bonding fingers has a die pad size of only 3.9 mm×3.9 mm because of the space required up by the inner row of bonding fingers in the dual row package body. The maximum die size that can be used in an application without ground bonds therefore is approximately 3.55 mm×3.55 mm. If a large die such as 4.5 mm×4.5 mm is needed, a larger package size of 8 mm×8 mm is required to accommodate the large die. A 7 mm×7 mm size a QFN package with a dual row of bonding fingers manufactured in accordance with the present invention, however, can accommodate a large die that is greater than the 3.55 mm×3.5 mm. It has been discovered that a large die at least 4.5 mm×4.5 mm can fit in the 7 mm×7 mm package resulting in a 60.7% increase in die size area that will fit into the same package thereby avoiding the need to use a larger QFN package for the 4.5 mm×4.5 mm die size.

Figure 12:
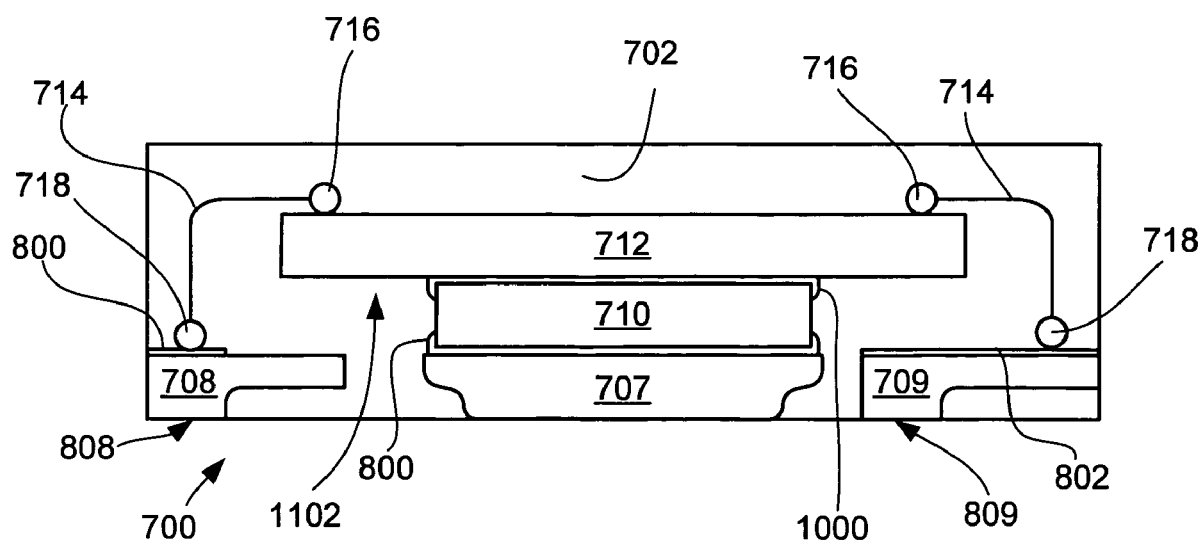
FIG. 12 is the structure of FIG. 11 after the large die has been electrically connected to the bonding fingers and then encapsulated in accordance with the present invention.

Referring now to FIG. 12, therein is shown the structure of FIG. 11 with the large die 712 connected to the outer bonding finger 708 and the inner bonding finger 709 with the plurality of bonding wires 714 using a suitable conventional wire bonding technique selected from the group consisting of ultrasonic bonding, thermosonic bonding, and combinations thereof using wire bonding equipment readily available in the semiconductor industry.

In the embodiment shown in FIG. 12, the plurality of bonding wires 714 are bonded to the large die 712 using the first plurality of wirebond connections 716, and to the outer bonding finger 708 and the inner bonding finger 709, respectively, using the second plurality of wirebond connections 718.

As previously discussed with respect to the semiconductor package 100 shown in FIG. 1 through FIG. 6, it has been discovered that use of a reverse loop wirebonding at the connection point on the large die 712 facilitates the use of the plurality of bonding wires 714 having substantially a 90° angle bend as shown in FIG. 12. The plurality of bonding wires 714 are substantially coplanar with the upper surface of the large die 712 at the connection point to the large die 712 and sharply curved downward to connect to the outer bonding finger 708 and the inner bonding finger 709, respectively. Thus, the desirable low vertical profile of the semiconductor package 700 is maintained despite the addition of the spacer 710.

While reverse loop wirebonding is a preferred method, a standard loop wirebonding method also can be used without departing from the spirit and scope of the present invention.

Additionally, the large die 712 can overlap the inner edge of the outer bonding finger 708 and the inner edge of the inner bonding finger 709 thereby accommodating the largest die possible in a package of a given size. The die pad 707, the outer bonding finger 708, the inner bonding finger 709, the spacer 710, the large die 712 and the plurality of bonding wires 714 are then encapsulated in the encapsulant 702, such as an epoxy mold compound or other suitable material, using conventional molding equipment to form the semiconductor package 700.

The first contact pad 808 of the outer bonding finger 708, and the second contact pad 809 of the inner bonding finger 709 can be used for subsequent connection of the semiconductor package 700 to a printed circuit board (not shown) in a conventional manner using, for example, solder paste. The first contact pad 808 and the second contact pad 809 may also have solder bumps (not shown) or other suitable connection materials or formations. The second contact pad 809 is positioned under the large die 712 so the large die 712 at least partially overlaps the second contact pad 809 of the inner bonding finger 709.

It will be apparent to one skilled in the art that positioning of the second contact pad 809 beneath the surface of the large die 712 results in a more compact arrangement of contact pads than if the semiconductor package 700 of the present invention was not used. If the permissible die size is limited by the size of the die pad, the contact pads are arranged outside the edges of the die.

Accordingly, the present invention results in the semiconductor package 700 that is more compact. Similar to the previous embodiment, the semiconductor package 700 is closer to being a true chip scale package.

Figure 13:
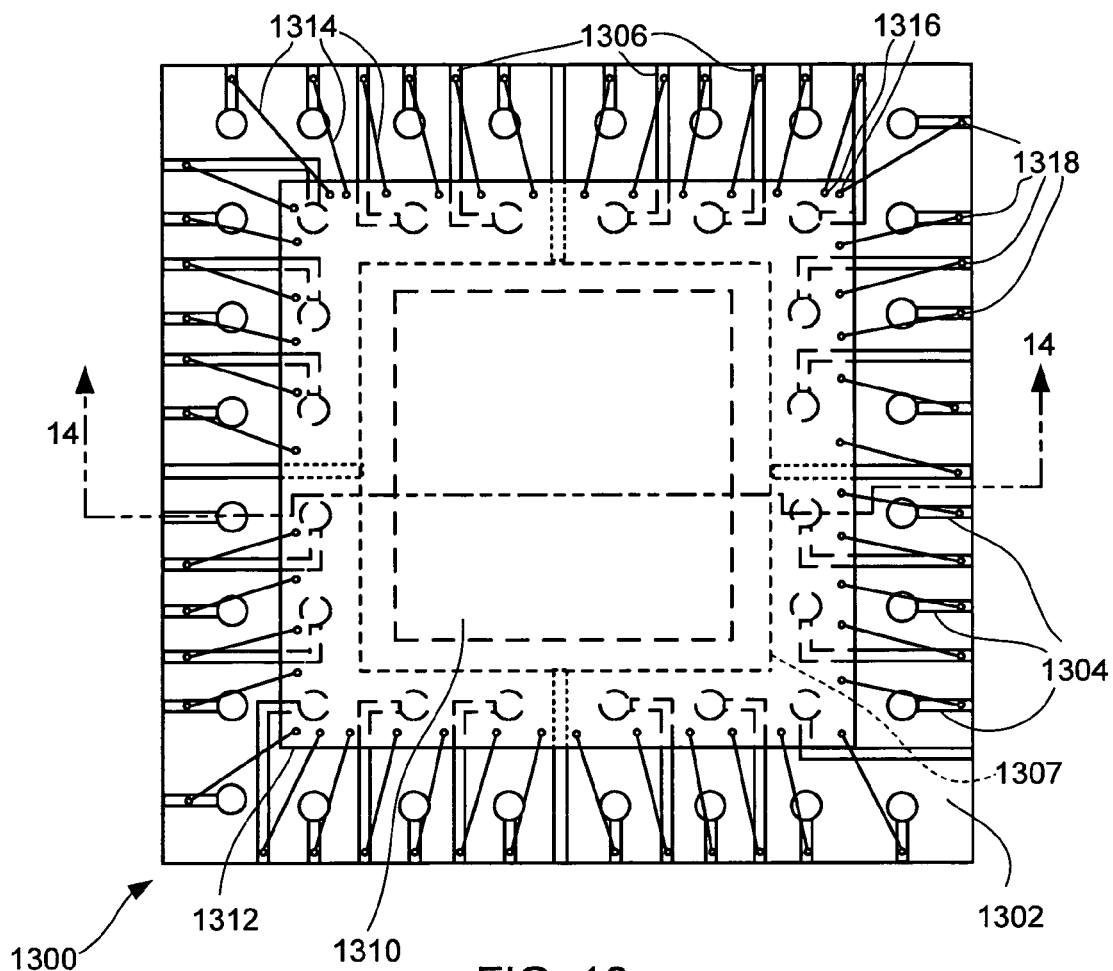
FIG. 13 is a plan view of a further embodiment of a semiconductor package having a dual row of contact pads manufactured in accordance with the present invention.

Referring now to FIG. 13, therein is shown a further embodiment of a semiconductor package 1300, such as a leadframe ball grid array (BGA) package, manufactured in accordance with the present invention. The semiconductor package 1300 comprises an encapsulant 1302, which encapsulates a plurality of outer bonding fingers 1304, and a plurality of inner bonding fingers 1306 positioned around the periphery of the encapsulant 1302. A die pad 1307 is located toward the center of the encapsulant 1302. A spacer 1310 is mounted on top of the die pad 1307, and a large die 1312 is mounted on top of the spacer 1310. A plurality of bonding wires 1314 connects the plurality of outer bonding fingers 1304 and the plurality of inner bonding fingers 1306 to the large die 1312. A first plurality of wirebond connections 1316, typically ball bonds, is used to connect the plurality of bonding wires 1314 to the large die 1312. A second plurality of wirebond connections 1318, typically ball bonds for reverse loop wirebonding and stitch bond for standard loop wirebonding, is used to connect the plurality of bonding wires 1314 to the plurality of outer bonding fingers 1304 and the plurality of inner bonding fingers 1306.

Figure 14:
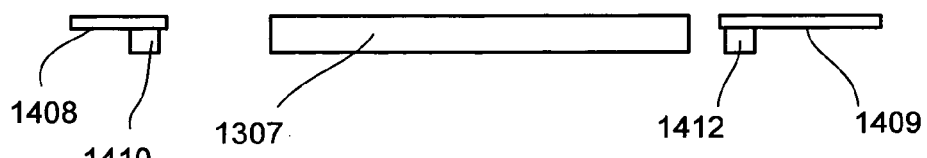
FIG. 14 is a cross-sectional view of a portion of the structure of FIG. 13 showing a die pad and an opposing pair of a plurality of bonding fingers taken along line 14-14 of FIG. 13.

Referring now to FIG. 14, therein is shown a cross-sectional view of a portion of the structure of FIG. 13 showing the die pad 1307 and opposing ones of the plurality of outer bonding fingers 1304 and the plurality of inner bonding fingers 1306 shown in FIG. 13 taken along line 14-14 of FIG. 13. The die pad 1307 is located between an outer bonding finger 1408 and an inner bonding finger 1409 which are located along the outer edge of the semiconductor package 1300. The outer bonding finger 1408 is representative of the plurality of outer bonding fingers 1304 in FIG. 13, and the inner bonding finger 1409 is representative of the plurality of inner bonding fingers 1306 in FIG. 13. The outer bonding finger 1408 and the inner bonding finger 1409 are made of a conductive material such as copper. A first contact pad 1410 is provided on the lower surface of the outer bonding finger 1408. A second contact pad 1412 is provided on the lower surface of the inner bonding finger 1409. The first contact pad 1410 and the second contact pad 1412 are a conductive material, such as copper, silver or other suitable material. The first contact pad 1410 and the second contact pad 1412 are used to subsequently connect the semiconductor package 1300 to a printed circuit board (not shown).

The leadframe, which temporarily mechanically connects the die pad 707 to the outer bonding finger 708 and the inner bonding finger 709, is omitted.

Figure 15:
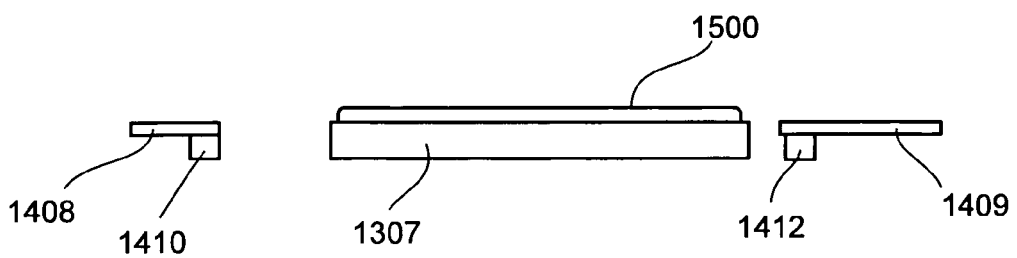
FIG. 15 is the structure of FIG. 14 after a first adhesive layer has been applied to the die pad.

Referring now to FIG. 15, therein is shown the structure of FIG. 14 after a first adhesive layer 1500 has been applied to the die pad 1307 in a conventional manner such as by applying an adhesive tape or dispensing an adhesive liquid or paste that is subsequently cured.

Figure 16:
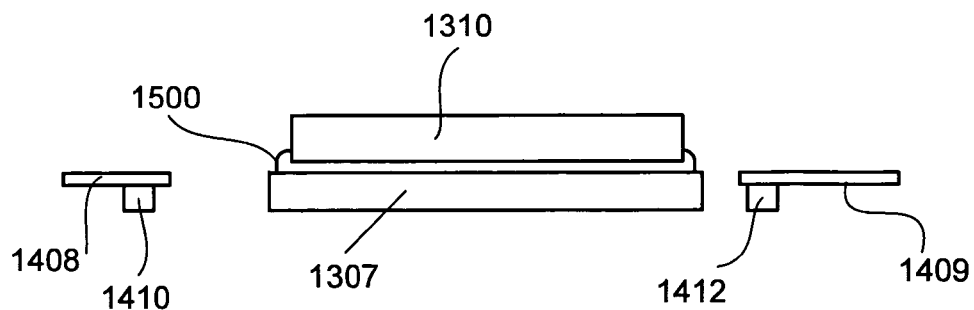
FIG. 16 is the structure of FIG. 15 after a spacer has been attached to the die pad.

Referring now to FIG. 16, therein is shown the structure of FIG. 15 with the spacer 1310 attached to the die pad 1307 using the first adhesive layer 1500.

Figure 17:
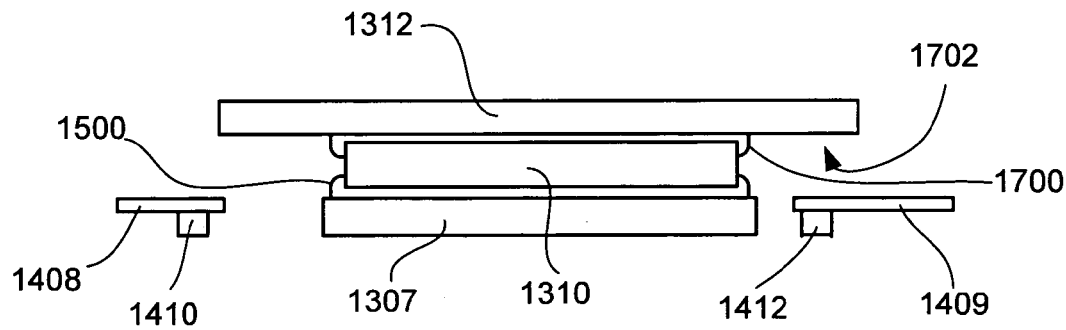
FIG. 17 is the structure of FIG. 16 after a large die has been attached to the spacer.

Referring now to FIG. 17 therein is shown the structure of FIG. 16 with the large die 1312 attached to the spacer 1310 using a second adhesive layer 1700. The large die 1312 is supported only by the die pad 1307 and the spacer 1320, which is smaller than the large die 1312. The large die 1312 at least partially overlaps the contact pad 1412 attached to the inner bonding finger 1409 and also overlaps the inner edge of the outer bonding finger 1408 and the inner edge of the inner bonding finger 1409. The large die 1312 has a bottom surface 1702 that is positioned above the outer bonding finger 1408. Accordingly, the use of the spacer 1310 enables usage of the large die 1312.

Referring now to FIG. 17 therein is shown the structure of FIG. 16 with the large die 1312 attached to the spacer 1310 using a second adhesive layer 1700. The large die 1312 at least partially overlaps the contact pad 1412 attached to the inner bonding finger 1409 and also overlaps the inner edge of the outer bonding finger 1408 and the inner edge of the inner bonding finger 1409. The large die 1312 has a bottom surface 1702 that is positioned above the outer bonding finger 1408. Accordingly, the use of the spacer 1310 enables usage of the large die 1312.

Figure 18:
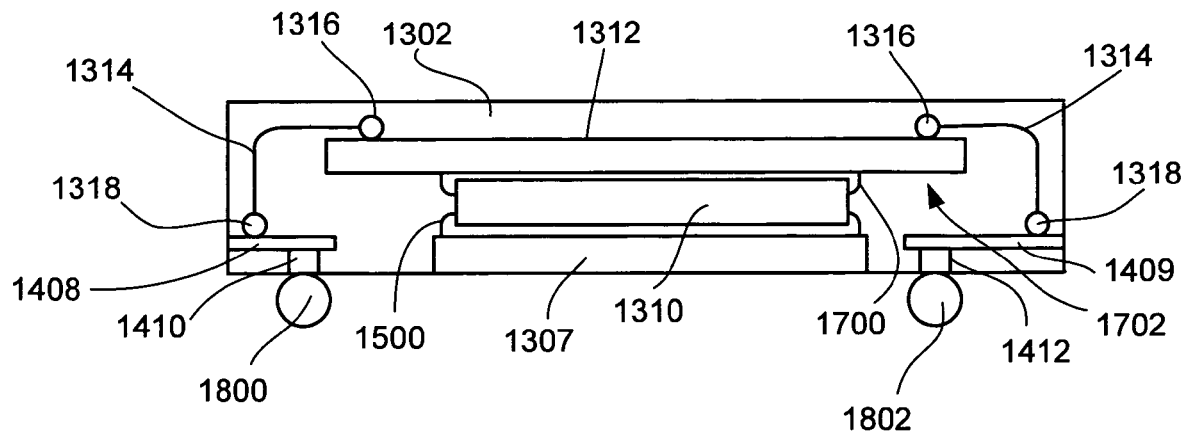
FIG. 18 is the structure of FIG. 17 after the large die has been electrically connected to the bonding fingers and then encapsulated in accordance with the present invention.

As previously discussed with respect to the semiconductor package 100 shown in FIG. 1 through FIG. 6, it has been discovered that use of a reverse loop wirebonding at the connection point on the large die 1312 facilitates the use of the plurality of bonding wires 1314 having substantially a 90° angle bend as shown in FIG. 18. The plurality of bonding wires 1314 are substantially coplanar with the upper surface of the large die 1312 at the connection point to the large die 1312 and sharply curved downward to connect to the outer bonding finger 1408 and the inner bonding finger 1409, respectively. Thus, the desirable low vertical profile of the semiconductor package 1300 is maintained despite the addition of the spacer 1310. While reverse loop wirebonding is a preferred method, a standard loop wirebonding method also can be used without departing from the spirit and scope of the present invention.

Additionally, the large die 1312 can at least partially overlap the inner edge of the outer bonding finger 1408 and the inner edge of the inner bonding finger 1409 thereby accommodating the largest die possible in a package of a given size. The die pad 1307, the outer bonding finger 1408, the inner bonding finger 1409, the spacer 1310, the large die 1312 and the plurality of bonding wires 1314 are then encapsulated in the encapsulant 1302, such as an epoxy mold compound or other suitable material, using conventional molding equipment to form the semiconductor package 1300.

The first contact pad 1410 of the outer bonding finger 1408, and the second contact pad 1412 of the inner bonding finger 1409 can be used for subsequent connection of the semiconductor package 1300 to a printed circuit board (not shown) in a conventional manner. The first contact pad 1410 has a first solder bump 1800 attached thereto, and the second contact pad 1412 has a second solder bump 1802 attached thereto. The second contact pad 1412 is positioned under the large die 1312 so the large die 1312 at least partially overlaps the second contact pad 1412 of the inner bonding finger 1409. It will be apparent to one skilled in the art that positioning of the second contact pad 1412 beneath the bottom surface 1702 of the large die 1312 results in a more compact arrangement of solder bumps than if the semiconductor package 1300 of the present invention was not used. If the permissible die size is limited by the size of the die pad, the solder bumps are arranged outside the edges of the die. Accordingly, the present invention results in the semiconductor package 1300 that is more compact. Similar to the previous embodiments, the semiconductor package 1300 is closer to being a true chip scale package.

Figure 19:
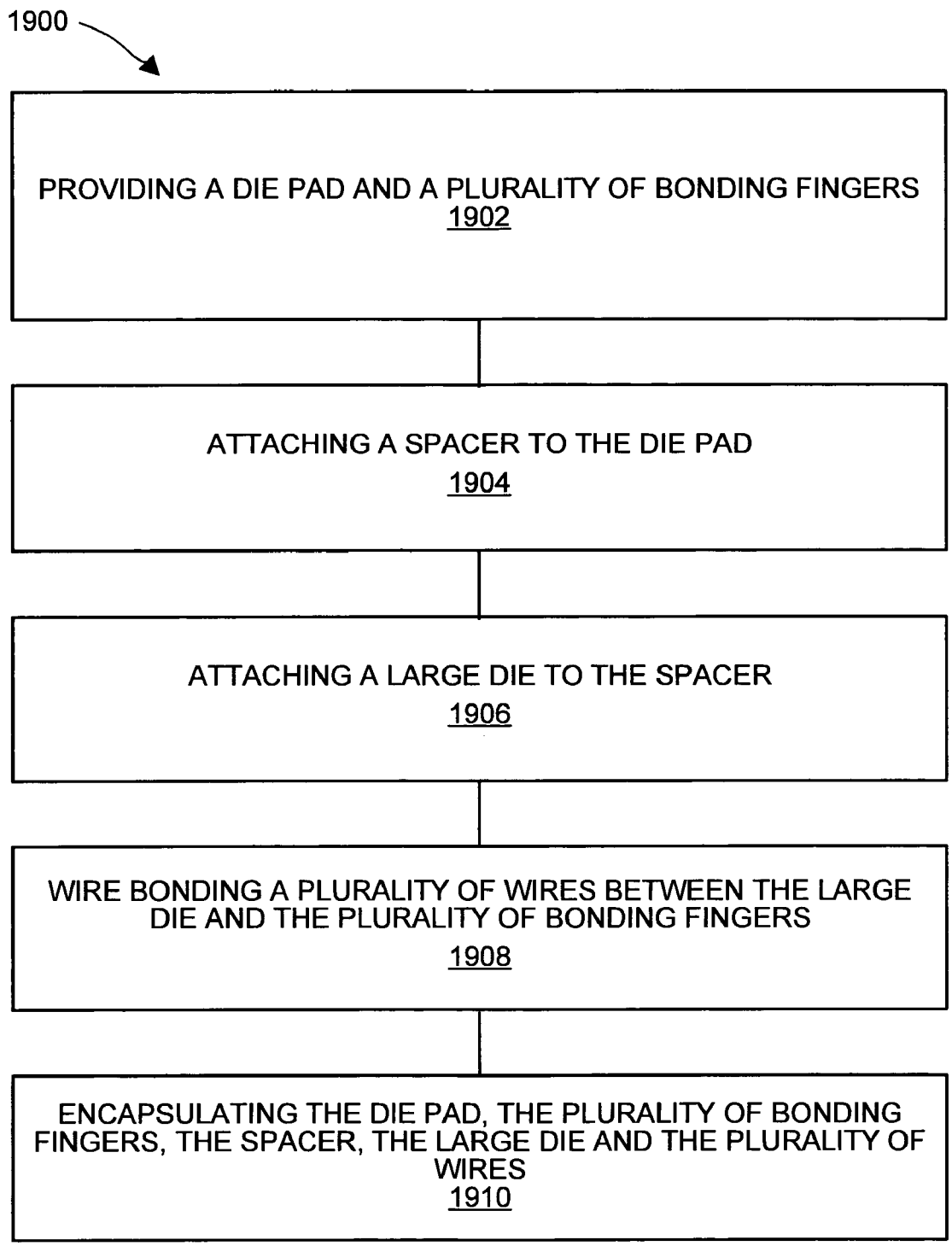
FIG. 19 is a flow diagram of the method of the present invention.

Referring now to FIG. 19, therein is shown the steps of a method 1900 of the present invention. The method 1900 for assembling a semiconductor package includes a step 1902 of providing a die pad and a plurality of bonding fingers; a step 1904 of attaching a spacer to the die pad; a step 1906 of attaching a large die to the spacer; a step 1908 of wire bonding a plurality of wires between the large die and the plurality of bonding fingers, and a step 1910 of encapsulating the die pad, the plurality of bonding fingers, the spacer, the large die and the plurality of wires.

While the invention has been described in conjunction with specific best modes, it is to be understood that many alternatives, modifications, and variations will be apparent to those skilled in the art in light of the foregoing description. Accordingly, it is intended to embrace all such alternatives, modifications, and variations, which fall within the spirit and scope of the included claims. All matters set forth herein or shown in the accompanying drawings are to be interpreted in an illustrative and non-limiting sense.

The invention claimed is:

1. A semiconductor package for a large die comprising:
   a die pad;
   a plurality of bonding fingers having contact pads;
   a spacer attached by a first adhesive to the die pad;
   the large die extending over the contact pads and the spacer,
      the large die attached by a second adhesive to the spacer
      and supported only by the first adhesive, the second
      adhesive, and the spacer on the die pad;
   bonding wires bonded between the large die and the plurality of bonding fingers, the bonding wires having portions parallel to a side of the large die; and an encapsulant to encapsulate the die pad, the plurality of bonding fingers, the spacer, the large die, and the bonding wires.

2. The semiconductor package as claimed in claim 1 wherein the spacer is a conductive material having a thickness in the range of about 100 microns to about 300 microns.

3. The semiconductor package as claimed in claim 1 wherein the large die overlaps the inner edges of the bonding fingers.

4. The semiconductor package as claimed in claim 1 wherein:
- the plurality of bonding fingers have a plurality of contact pads thereon; and
- the large die at least partially overlaps the plurality of contact pads.

5. The semiconductor package as claimed in claim 1 wherein the bonding wires have a substantially 90° angle bend.

6. A semiconductor package for a large die comprising:
- a die pad;
- a plurality of inner bonding fingers having inner contact pads;
- a plurality of outer bonding fingers;
- a spacer attached by a first adhesive to the die pad;
- the large die extending over the inner contact pads and the spacer, the large die attached by a second adhesive to the spacer and only supported by the first adhesive, the second adhesive, and the spacer on the die pad;
- a plurality of bonding wires connected between the large die and the plurality of inner bonding fingers and the plurality of outer bonding fingers, the bonding wires having a portion substantially parallel to a side of the large die; and
- an encapsulant to encapsulate the die pad, the plurality of inner bonding fingers, the plurality of outer bonding fingers, the spacer, the large die, and the plurality of bonding wires.

7. The semiconductor package as claimed in claim 6 wherein the spacer is a conductive material having a thickness in the range of about 100 microns to about 300 microns.

8. The semiconductor package as claimed in claim 6 wherein the large die overlaps the inner edge of the plurality of inner bonding fingers.

9. The semiconductor package as claimed in claim 6 wherein:
- the plurality of inner bonding fingers have a plurality of contact pads thereon; and
- the large die at least partially overlaps the plurality of contact pads.

10. The semiconductor package as claimed in claim 6 wherein the semiconductor package is a quad flat-packed non-leaded package, a leadframe ball grid array package, or a combination thereof.

* * * * *

UNITED STATES PATENT AND TRADEMARK OFFICE
CERTIFICATE OF CORRECTION

| | | |
|---|---|---|
| PATENT NO. | : 7,595,551 B2 | |
| APPLICATION NO. | : 11/169850 | |
| DATED | : September 29, 2009 | |
| INVENTOR(S) | : Ramakrishna | |

It is certified that error appears in the above-identified patent and that said Letters Patent is hereby corrected as shown below:

<u>Column 9</u>

1. Line 37, delete "the spacer 1320," and insert therefor --the spacer 1310,--

2. Lines 46-55, delete:

"Referring now to FIG. 17, therein is shown the structure of FIG. 16 with the large die 1312 attached to the spacer 1310 using a second adhesive layer 1700. The large die 1312 at least partially overlaps the contact pad 1412 attached to the inner bonding finger 1409 and also overlaps the inner edge of the outer bonding finger 1408 and the inner edge of the inner bonding finger 1409. The large die 1312 has a bottom surface 1702 that is positioned above the outer bonding finger 1408. Accordingly, the use of the spacer 1310 enables usage of the large die 1312."

And insert therefor:

--Referring now to FIG. 18, therein is shown the structure of FIG. 17 with the large die 1312 connected to the outer bonding finger 1408 and the inner bonding finger 1409 with the plurality of bonding wires 1314 using a suitable conventional wire bonding technique selected from the group consisting of ultrasonic bonding, thermosonic bonding, and combinations thereof using wire bonding equipment readily available in the semiconductor industry. In the embodiment shown in FIG. 18, the plurality of bonding wires 1314 are bonded to the large die 1312 using the first plurality of wirebond connections 1316, and to the outer bonding finger 1408 and the inner bonding

UNITED STATES PATENT AND TRADEMARK OFFICE
CERTIFICATE OF CORRECTION

PATENT NO. : 7,595,551 B2
APPLICATION NO. : 11/169850
DATED : September 29, 2009
INVENTOR(S) : Ramakrishna It is certified that error appears in the above-identified patent and that said Letters Patent is hereby corrected as shown below:

finger 1409, respectively, using the second plurality of wirebond connections 1318.--

Signed and Sealed this

Twenty-ninth Day of December, 2009

David J. Kappos
*Director of the United States Patent and Trademark Office*